US009178130B2

(12) United States Patent
Shimizu et al.

(10) Patent No.: US 9,178,130 B2
(45) Date of Patent: Nov. 3, 2015

(54) PIEZOELECTRIC/ELECTROSTRICTIVE ELEMENT

(71) Applicant: NGK Insulators, Ltd., Nagoya (JP)

(72) Inventors: Hideki Shimizu, Oubu (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/187,879

(22) Filed: Feb. 24, 2014

(65) Prior Publication Data
US 2014/0167567 A1    Jun. 19, 2014

Related U.S. Application Data

(62) Division of application No. 12/032,128, filed on Feb. 15, 2008, now Pat. No. 8,742,650.

(60) Provisional application No. 60/890,636, filed on Feb. 20, 2007.

(51) Int. Cl.
*H01L 41/187* (2006.01)
*H01L 41/047* (2006.01)
(Continued)

(52) U.S. Cl.
CPC ......... *H01L 41/0477* (2013.01); *B41J 2/14233* (2013.01); *H01L 41/0973* (2013.01);
(Continued)

(58) Field of Classification Search
CPC ... H01L 41/18; H01L 41/187; H01L 41/1875; H01L 41/1876; H01L 41/0477; H01L 41/0478

USPC ............. 310/358, 363; 252/62.9 R, 62.9 PZ
See application file for complete search history.

(56) References Cited

U.S. PATENT DOCUMENTS 6,090,306 A * 7/2000 Tsubokura et al. ...... 252/62.9 R
6,248,254 B1 * 6/2001 Kimura et al. ........... 252/62.9 R
(Continued)

FOREIGN PATENT DOCUMENTS

EP    1 148 561 A2    10/2001
EP    1 321 986 A2    6/2003
(Continued)

OTHER PUBLICATIONS

International Search Report and Written Opinion mailed Mar. 18, 2008 (PCT/JP2008/052432).

*Primary Examiner* — Derek Rosenau
(74) *Attorney, Agent, or Firm* — Burr & Brown, PLLC

(57) ABSTRACT

In the manufacture of a laminated piezoelectric/electrostrictive element by lamination of a piezoelectric/electrostrictive film and an electrode film containing either platinum or an alloy composed mainly of platinum and having a thickness of 2.0 μm or less, both or either one of yttrium oxide ($Y_2O_3$) and cerium oxide ($CeO_2$) is added to the electrode film or the piezoelectric/electrostrictive film, and the electrode film and the piezoelectric/electrostrictive film are fired simultaneously. This simultaneously achieves a reduced thickness and improved thermal resistance of the electrode film and a reduced change in piezoelectric/electrostrictive properties with time, thereby producing a piezoelectric/electrostrictive element with good initial piezoelectric/electrostrictive properties and with a small change in the piezoelectric/electrostrictive properties with time.

3 Claims, 6 Drawing Sheets

| TEST SAMPLES | AMOUNT OF CaO ADDED (PART BY WEIGHT) | AMOUNT OF CeO2 ADDED | | WHERE TO ADD | THICKNESS OF ELECTRODE FILM (μm) | DISPLACEMENT (μm) | | | |
|---|---|---|---|---|---|---|---|---|---|
| | | (PART BY WEIGHT) | (MOLAR RATIO) | | | INITIAL STAGE | AFTER 1 WEEK | AFTER 2 WEEKS | AFTER 3 WEEKS |
| 35 | 0.1 | 0.1 | 0.2 PART | ELECTRODE FILM | 1.1 | 0.227 | 0.227 | 0.228 | 0.226 |
| 36 | 0.1 | 0.4 | 1 PART | ELECTRODE FILM | 1.2 | 0.225 | 0.223 | 0.222 | 0.225 |
| 37 | 0.1 | 0.8 | 2 PARTS | ELECTRODE FILM | 1.2 | 0.225 | 0.226 | 0.225 | 0.227 |
| 38 | 0.1 | 1.2 | 3 PARTS | ELECTRODE FILM | 1.2 | 0.228 | 0.226 | 0.226 | 0.226 |
| 39 | 0.5 | 0.5 | 0.2 PART | ELECTRODE FILM | 1.2 | 0.228 | 0.228 | 0.228 | 0.228 |
| 40 | 0.5 | 2.0 | 1 PART | ELECTRODE FILM | 1.3 | 0.226 | 0.226 | 0.226 | 0.226 |
| 41 | 0.5 | 4.0 | 2 PARTS | ELECTRODE FILM | 1.3 | 0.231 | 0.230 | 0.229 | 0.229 |
| 42 | 0.5 | 6.0 | 3 PARTS | ELECTRODE FILM | 1.2 | 0.225 | 0.225 | 0.225 | 0.225 |

(51) Int. Cl.
  *B41J 2/14* (2006.01)
  *H01L 41/09* (2006.01)
  *H01L 41/273* (2013.01)
  *H01L 41/27* (2013.01)
  *H01L 41/083* (2006.01)

(52) U.S. Cl.
  CPC .......... *H01L41/187* (2013.01); *H01L 41/1871* (2013.01); *H01L 41/1876* (2013.01); *H01L 41/27* (2013.01); *H01L 41/273* (2013.01); *B41J 2002/14258* (2013.01); *B41J 2202/03* (2013.01); *H01L 41/083* (2013.01); *Y10T 428/26* (2015.01)

(56) References Cited

U.S. PATENT DOCUMENTS

| | | |
|---|---|---|
| 6,565,997 B2 | 5/2003 | Kashiwaya |
| 6,624,549 B2 | 9/2003 | Takeuchi et al. |
| 6,882,089 B2 | 4/2005 | Kashiwaya et al. |
| 6,998,763 B2 | 2/2006 | Takeuchi et al. |
| 7,547,401 B2 | 6/2009 | Liufu |
| 2004/0188659 A1 | 9/2004 | Tomita et al. |

FOREIGN PATENT DOCUMENTS

| | | |
|---|---|---|
| EP | 1 321 987 A2 | 6/2003 |
| EP | 1 343 209 A2 | 9/2003 |
| JP | 2002-328319 | 11/2002 |
| JP | 2003-152235 | 5/2003 |
| JP | 2006-121012 | 5/2006 |
| JP | 2006-299385 A1 | 11/2006 |
| JP | 2006-302848 A1 | 11/2006 |
| JP | 2006-335576 A1 | 12/2006 |

* cited by examiner

FIG. 3

| TEST SAMPLES | AMOUNT OF Y2O3 ADDED (PART BY WEIGHT) | WHERE TO ADD Y2O3 | AMOUNT OF CeO2 ADDED (PART BY WEIGHT) | WHERE TO ADD CeO2 | THICKNESS OF ELECTRODE FILM (μm) | DISPLACEMENT (μm) | | | |
|---|---|---|---|---|---|---|---|---|---|
| | | | | | | INITIAL STAGE | AFTER 1 WEEK | AFTER 2 WEEKS | AFTER 3 WEEKS |
| 1 | 0 | NOWHERE | 0 | NOWHERE | 2.5 | 0.165 | 0.166 | 0.165 | 0.165 |
| 2 | 0 | NOWHERE | 0 | NOWHERE | 1.8 | 0.190 | 0.182 | 0.178 | 0.175 |
| 3 | 0 | NOWHERE | 0 | NOWHERE | 1.6 | DISCONNECTED | DISCONNECTED | DISCONNECTED | DISCONNECTED |
| 4 | 0.1 | ELECTRODE FILM | 0 | NOWHERE | 1.9 | 0.199 | 0.198 | 0.190 | 0.182 |
| 5 | 0.1 | ELECTRODE FILM | 0 | NOWHERE | 1.4 | 0.216 | 0.210 | 0.204 | 0.200 |
| 6 | 0.1 | ELECTRODE FILM | 0 | NOWHERE | 1.3 | DISCONNECTED | DISCONNECTED | DISCONNECTED | DISCONNECTED |
| 7 | 0 | NOWHERE | 0.6 | ELECTRODE FILM | 1.8 | 0.192 | 0.192 | 0.191 | 0.190 |
| 8 | 0 | NOWHERE | 0.6 | ELECTRODE FILM | 1.6 | 0.210 | 0.210 | 0.209 | 0.208 |
| 9 | 0 | NOWHERE | 0.6 | ELECTRODE FILM | 1.2 | DISCONNECTED | DISCONNECTED | DISCONNECTED | DISCONNECTED |
| 10 | 0.1 | ELECTRODE FILM | 0.6 | ELECTRODE FILM | 1.8 | 0.200 | 0.201 | 0.197 | 0.198 |
| 11 | 0.1 | ELECTRODE FILM | 0.6 | ELECTRODE FILM | 1.2 | 0.228 | 0.229 | 0.225 | 0.227 |

FIG. 4

| TEST SAMPLES | AMOUNT OF Y2O3 ADDED (PART BY WEIGHT) | WHERE TO ADD Y2O3 | AMOUNT OF CeO2 ADDED (PART BY WEIGHT) | WHERE TO ADD CeO2 | THICKNESS OF ELECTRODE FILM (μm) | DISPLACEMENT (μm) | | | |
|---|---|---|---|---|---|---|---|---|---|
| | | | | | | INITIAL STAGE | AFTER 1 WEEK | AFTER 2 WEEKS | AFTER 3 WEEKS |
| 12 | 0.1 | PIEZOELECTRIC/ ELECTROSTRICTIVE FILM | 0.6 | PIEZOELECTRIC/ ELECTROSTRICTIVE FILM | 1.8 | 0.200 | 0.201 | 0.197 | 0.198 |
| 13 | 0.1 | PIEZOELECTRIC/ ELECTROSTRICTIVE FILM | 0.6 | PIEZOELECTRIC/ ELECTROSTRICTIVE FILM | 1.5 | DISCONNECTED | DISCONNECTED | DISCONNECTED | DISCONNECTED |
| 14 | 0.1 | PIEZOELECTRIC/ ELECTROSTRICTIVE FILM | 0.6 | PIEZOELECTRIC/ ELECTROSTRICTIVE FILM | 1.2 | DISCONNECTED | DISCONNECTED | DISCONNECTED | DISCONNECTED |
| 15 | 0.1 | ELECTRODE FILM | 0.6 | PIEZOELECTRIC/ ELECTROSTRICTIVE FILM | 1.4 | 0.220 | 0.218 | 0.216 | 0.216 |
| 16 | 0.1 | ELECTRODE FILM | 0.6 | PIEZOELECTRIC/ ELECTROSTRICTIVE FILM | 1.2 | DISCONNECTED | DISCONNECTED | DISCONNECTED | DISCONNECTED |
| 17 | 0.1 | PIEZOELECTRIC/ ELECTROSTRICTIVE FILM | 0.6 | ELECTRODE FILM | 1.6 | 0.216 | 0.215 | 0.216 | 0.216 |
| 18 | 0.1 | PIEZOELECTRIC/ ELECTROSTRICTIVE FILM | 0.6 | ELECTRODE FILM | 1.2 | DISCONNECTED | DISCONNECTED | DISCONNECTED | DISCONNECTED |

FIG. 5

| TEST SAMPLES | AMOUNT OF Y2O3 ADDED (PART BY WEIGHT) | AMOUNT OF CeO2 ADDED (PART BY WEIGHT) | WHERE TO ADD | THICKNESS OF ELECTRODE FILM ($\mu$m) | DISPLACEMENT ($\mu$m) | | | |
|---|---|---|---|---|---|---|---|---|
| | | | | | INITIAL STAGE | AFTER 1 WEEK | AFTER 2 WEEKS | AFTER 3 WEEKS |
| 19 | 0.1 | 0.1 | ELECTRODE FILM | 1.1 | 0.230 | 0.225 | 0.228 | 0.226 |
| 20 | 0.1 | 0.3 | ELECTRODE FILM | 1.2 | 0.225 | 0.223 | 0.222 | 0.225 |
| 21 | 0.1 | 0.6 | ELECTRODE FILM | 1.2 | 0.228 | 0.229 | 0.225 | 0.227 |
| 22 | 0.1 | 1.2 | ELECTRODE FILM | 1.2 | 0.225 | 0.226 | 0.224 | 0.224 |
| 23 | 0.1 | 1.8 | ELECTRODE FILM | 1.3 | 0.212 | 0.211 | 0.208 | 0.209 |
| 24 | 0.3 | 0.3 | ELECTRODE FILM | 1.2 | 0.230 | 0.228 | 0.228 | 0.228 |
| 25 | 0.3 | 0.9 | ELECTRODE FILM | 1.3 | 0.228 | 0.226 | 0.226 | 0.226 |
| 26 | 0.3 | 1.8 | ELECTRODE FILM | 1.2 | 0.225 | 0.223 | 0.220 | 0.222 |
| 27 | 0.6 | 1.8 | ELECTRODE FILM | 1.2 | 0.220 | 0.218 | 0.221 | 0.216 |
| 28 | 0.6 | 3.6 | ELECTRODE FILM | 1.2 | 0.225 | 0.222 | 0.222 | 0.221 |
| 29 | 0.9 | 2.7 | ELECTRODE FILM | 1.2 | 0.210 | 0.209 | 0.209 | 0.208 |

F I G . 6

| TEST SAMPLES | AMOUNT OF Y2O3 ADDED (PART BY WEIGHT) | AMOUNT OF CeO2 ADDED (PART BY WEIGHT) | WHERE TO ADD | THICKNESS OF ELECTRODE FILM ($\mu$m) | PIEZOELECTRIC/ ELECTROSTRICTIVE MATERIAL | DISPLACEMENT ($\mu$m) | | | |
|---|---|---|---|---|---|---|---|---|---|
| | | | | | | INITIAL STAGE | AFTER 1 WEEK | AFTER 2 WEEKS | AFTER 3 WEEKS |
| 30 | 0.1 | 0.6 | ELECTRODE FILM | 1.2 | A | 0.228 | 0.229 | 0.225 | 0.227 |
| 31 | 0.1 | 0.6 | ELECTRODE FILM | 1.2 | B | 0.218 | 0.219 | 0.219 | 0.219 |
| 32 | 0.1 | 0.6 | ELECTRODE FILM | 1.1 | C | 0.230 | 0.231 | 0.230 | 0.228 |
| 33 | 0.1 | 0.6 | ELECTRODE FILM | 1.2 | D | 0.200 | 0.200 | 0.198 | 0.198 |
| 34 | 0.1 | 0.6 | ELECTRODE FILM | 1.2 | E | 0.195 | 0.194 | 0.193 | 0.192 |

A  16Pb(Mg$_{1/3}$Nb$_{2/3}$)O$_3$+4Pb(Ni$_{1/3}$Nb$_{2/3}$)O$_3$+43PbTiO$_3$+37PbZrO$_3$

B  20Pb(Mg$_{1/3}$Nb$_{2/3}$)O$_3$+43PbTiO$_3$+37PbZrO$_3$

C  30Pb(Ni$_{1/3}$Nb$_{2/3}$)O$_3$+42PbTiO$_3$+28PbZrO$_3$

D  10Pb(Yb$_{1/2}$Nb$_{1/2}$)O$_3$+48PbTiO$_3$+42PbZrO$_3$

E  24Pb(Zn$_{1/2}$Nb$_{1/2}$)O$_3$+40PbTiO$_3$+36PbZrO$_3$

F I G. 7

| TEST SAMPLES | AMOUNT OF CaO ADDED (PART BY WEIGHT) | AMOUNT OF CeO2 ADDED | | WHERE TO ADD | THICKNESS OF ELECTRODE FILM ($\mu$m) | DISPLACEMENT ($\mu$m) | | | |
|---|---|---|---|---|---|---|---|---|---|
| | | (PART BY WEIGHT) | (MOLAR RATIO) | | | INITIAL STAGE | AFTER 1 WEEK | AFTER 2 WEEKS | AFTER 3 WEEKS |
| 35 | 0.1 | 0.1 | 0.2 PART | ELECTRODE FILM | 1.1 | 0.227 | 0.227 | 0.228 | 0.226 |
| 36 | 0.1 | 0.4 | 1 PART | ELECTRODE FILM | 1.2 | 0.225 | 0.223 | 0.222 | 0.225 |
| 37 | 0.1 | 0.8 | 2 PARTS | ELECTRODE FILM | 1.2 | 0.225 | 0.226 | 0.225 | 0.227 |
| 38 | 0.1 | 1.2 | 3 PARTS | ELECTRODE FILM | 1.2 | 0.228 | 0.226 | 0.226 | 0.226 |
| 39 | 0.5 | 0.5 | 0.2 PART | ELECTRODE FILM | 1.2 | 0.228 | 0.228 | 0.228 | 0.228 |
| 40 | 0.5 | 2.0 | 1 PART | ELECTRODE FILM | 1.3 | 0.226 | 0.226 | 0.226 | 0.226 |
| 41 | 0.5 | 4.0 | 2 PARTS | ELECTRODE FILM | 1.3 | 0.231 | 0.230 | 0.229 | 0.229 |
| 42 | 0.5 | 6.0 | 3 PARTS | ELECTRODE FILM | 1.2 | 0.225 | 0.225 | 0.225 | 0.225 |

PIEZOELECTRIC/ELECTROSTRICTIVE ELEMENT

CROSS-REFERENCE TO RELATED APPLICATIONS

This application is a divisional application of U.S. patent application Ser. No. 12/032,128, filed Feb. 15, 2008, which claims the benefit of U.S. patent application Ser. No. 60/890,636, filed Feb. 20, 2007, the entireties of which are incorporated herein by reference.

BACKGROUND OF THE INVENTION

1. Field of the Invention

The present invention relates to a laminated piezoelectric/electrostrictive element.

2. Description of the Related Art

In a laminated piezoelectric/electrostrictive element formed by laminating a piezoelectric/electrostrictive film and an electrode film, for sufficient densification of the piezoelectric/electrostrictive film, it is necessary to fire the piezoelectric/electrostrictive film at a temperature of 1200° C. or higher. For this reason, the electrode film that is fired simultaneously with the piezoelectric/electrostrictive film needs to have thermal resistance capable of withstanding temperatures of 1200° C. or higher. Thus, platinum that may contribute to an improvement in the thermal resistance of the electrode film is often selected as a material for the electrode film fired simultaneously with the piezoelectric/electrostrictive film.

Meanwhile, in order to improve the piezoelectric/electrostrictive properties of the laminated piezoelectric/electrostrictive element, reducing the thickness of the electrode film as an inner-layer electrode is effective.

In conventional techniques, a platinum powder contained in an electrode paste used for formation of the electrode film is pulverized into small particles to reduce the thickness of the electrode film, and a variety of oxides are added to the platinum powder in order to improve the thermal resistance of the electrode film. However, those conventional techniques have the problem that reducing the thickness of the electrode film to 2.0 μm or less reduces the thermal resistance of the electrode film, thereby causing disconnection of the electrode film at the time of simultaneous firing.

One solution that has been suggested to address this problem is to, in addition to adding a variety of oxides to a platinum powder, control the crystallite diameter of the platinum powder to be within the range of 60 nm to 100 nm through thermal treatment, thereby to improve the thermal resistance of the electrode film (Japanese Patent Application Laid-Open Nos. 2006-302848 and 2006-299385).

This solution results in a reduced thickness and improved thermal resistance of the electrode film, but there is still a problem with the piezoelectric/electrostrictive properties greatly changing with time.

SUMMARY OF THE INVENTION

The invention relates to a laminated piezoelectric/electrostrictive element. According to a first aspect of the invention, a laminated piezoelectric/electrostrictive element includes the follows: an electrode film being a sintered body of either platinum or an alloy composed mainly of platinum and having a thickness of 2.0 μm or less; and a piezoelectric/electrostrictive film being a sintered body of a piezoelectric/electrostrictive material containing 0.01 to 0.60 part by weight of yttrium oxide to 100 parts by weight of platinum contained in the electrode film and containing 0.1 to less than 1.8 parts by weight of cerium oxide to 1 part by weight of yttrium oxide.

According to a second aspect of the invention, a laminated piezoelectric/electrostrictive element is manufactured by the following steps: the step of forming a piezoelectric/electrostrictive film including a piezoelectric/electrostrictive material; the step of forming an electrode film containing either platinum or an alloy composed mainly of platinum and containing at least either one of yttrium oxide and cerium oxide; and the step of firing the electrode film and the piezoelectric/electrostrictive film adjacent to each other simultaneously at a temperature of 1200° C. or higher. In the piezoelectric/electrostrictive element, the electrode film contains 0.01 to 0.60 part by weight of yttrium oxide to 100 parts by weight of platinum and contains 0.1 to less than 1.8 parts by weight of cerium oxide to 1 part by weight of yttrium oxide. The electrode film after simultaneous firing has a thickness of 2.0 μm or less.

According to a third aspect of the invention, a laminated piezoelectric/electrostrictive element is manufactured by the following steps: the step of forming a piezoelectric/electrostrictive film including a piezoelectric/electrostrictive material; the step of forming an electrode film containing either platinum or an alloy composed mainly of platinum and containing yttrium oxide and cerium oxide, the electrode film containing 0.01 to 0.60 part by weight of yttrium oxide to 100 parts by weight or platinum and containing 0.1 to less than 1.8 parts by weight of cerium oxide to 1 part by weight of yttrium oxide; and the step of firing the electrode film and the piezoelectric/electrostrictive film adjacent to each other simultaneously at a temperature of 1200° C. or higher. In the piezoelectric/electrostrictive element, the electrode film after simultaneous firing has a thickness of 2.0 μm or less.

According to a fourth aspect of the invention, a laminated piezoelectric/electrostrictive element includes the follows: an electrode film being a sintered body of either platinum or an alloy composed mainly of platinum and having a thickness of 2.0 μm or less; and a piezoelectric/electrostrictive film being a sintered body of a piezoelectric/electrostrictive material containing 0.1 to 0.5 part by weight of calcium oxide to 100 parts by weight of platinum contained in the electrode film and containing 0.2 to 3.0 parts by mol of cerium oxide to 1 part by mol of calcium oxide.

According to a fifth aspect of the invention, a laminated piezoelectric/electrostrictive element is manufactured by the following steps: the step of forming a piezoelectric/electrostrictive film including a piezoelectric/electrostrictive material; the step of forming an electrode film containing either platinum or an alloy composed mainly of platinum and containing at least either one of calcium oxide and cerium oxide; and the step of firing the electrode film and the piezoelectric/electrostrictive film adjacent to each other simultaneously at a temperature of 1200° C. or higher. In the piezoelectric/electrostrictive element, the electrode film contains 0.1 to 0.5 part by weight of calcium oxide to 100 parts by weight of platinum and contains 0.2 to 3.0 parts by mol of cerium oxide to 1 part by mol of calcium oxide. The electrode film after simultaneous firing has a thickness of 2.0 μm or less.

According to a sixth aspect of the invention, a laminated piezoelectric/electrostrictive element is manufactured by the following steps: the step of forming a piezoelectric/electrostrictive film including a piezoelectric/electrostrictive material; the step of forming an electrode film containing either platinum or an alloy composed mainly of platinum and containing calcium oxide and cerium oxide, the electrode film containing 0.1 to 0.5 part by weight off calcium oxide to 100 parts by weight of platinum and containing 0.2 to 3.0 parts by mol of cerium oxide to 1 part by mol of calcium oxide; and the step of firing the electrode film and the piezoelectric/electrostrictive film adjacent to each other simultaneously at a temperature of 1200° C. or higher. In the piezoelectric/electrostrictive element, the electrode film after simultaneous firing has a thickness of 2.0 μm or less.

It is therefore possible to simultaneously achieve a reduced thickness and improved thermal resistance of the electrode film and a reduced change in piezoelectric/electrostrictive properties with time. This produces a piezoelectric/electrostrictive element with good initial piezoelectric/electrostrictive properties and with a small change in the piezoelectric/electrostrictive properties with time.

BRIEF DESCRIPTION OF THE DRAWINGS

FIG. 3 provides a listing of the results of displacement measurements on test samples 1 to 11 under different conditions, such as addition or non-addition of yttrium oxide and cerium oxide, and the thickness of an electrode film 73.

FIG. 4 provides a listing of the results of displacement measurements on test samples 12 to 18 with different ways of adding yttrium oxide and cerium oxide and different thicknesses of the electrode film 73.

FIG. 5 provides a listing of the results of displacement measurements on test samples 19 to 29 with different amounts of yttrium oxide and cerium oxide added.

FIG. 6 provides a listing of the results of displacement measurements on test samples 30 to 34 with different piezoelectric/electrostrictive materials.

FIG. 7 provides a listing of the results of displacement measurements on test samples 35 to 42 with different amounts of calcium oxide and cerium oxide added.

DETAILED DESCRIPTION OF THE INVENTION

<Introduction>

According to the invention, in the manufacture of a laminated piezoelectric/electrostrictive element formed by lamination of a piezoelectric/electrostrictive film and an electrode film containing either platinum or an alloy composed mainly of platinum and having a thickness of 2.0 μm or less, both of yttrium oxide ($Y_2O_3$) or calcium oxide (CaO) (hereinafter referred to as a "first additive") and cerium oxide ($CeO_2$) (hereinafter referred to as a "second additive") or either one of them is added to the electrode film or the piezoelectric/electrostrictive film, and the electrode film and the piezoelectric/electrostrictive film are fired simultaneously. This simultaneously achieves a reduced thickness and improved thermal resistance of the electrode film and a reduced change in piezoelectric/electrostrictive properties with time, thereby producing a piezoelectric/electrostrictive element with good initial piezoelectric/electrostrictive properties and with a small change in the piezoelectric/electrostrictive properties with time.

<Example of Structure of Piezoelectric/electrostrictive Element>

Figure 1:
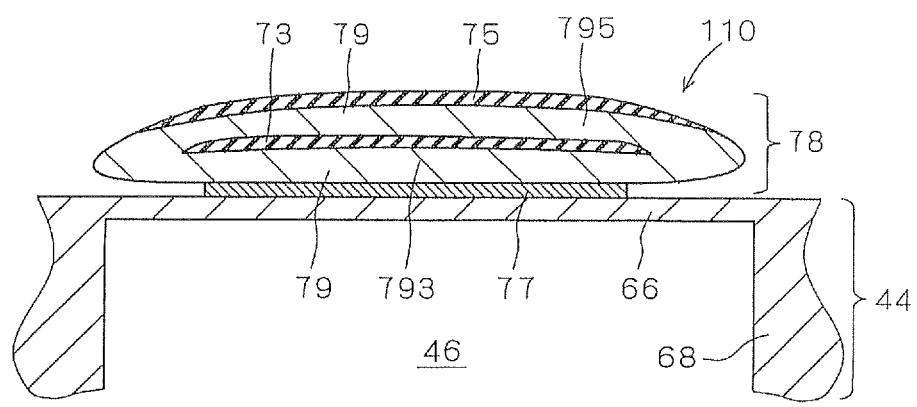
FIG. 1 is a cross-sectional view of a laminated piezoelectric/electrostrictive element according to a preferred embodiment of the invention.
Figure 2:
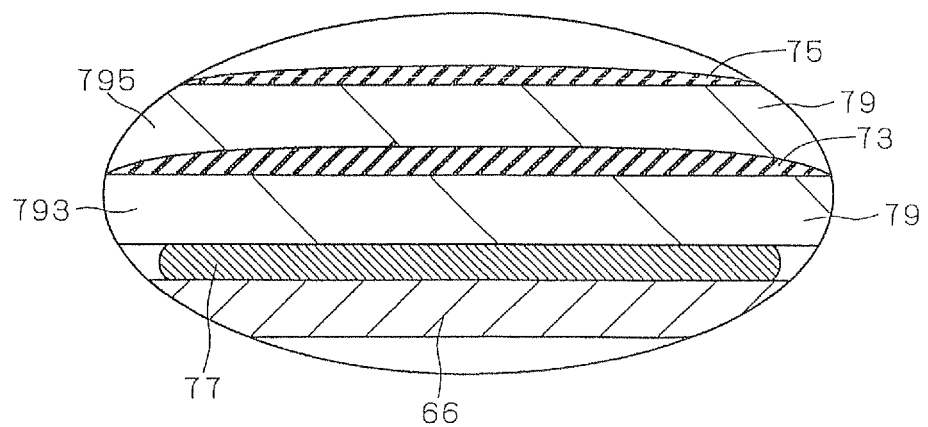
FIG. 2 is a partially enlarged cross-sectional view of FIG. 1.

FIGS. 1 and 2 show, by way of example, a structure of a laminated piezoelectric/electrostrictive element according to a preferred embodiment of the invention. FIG. 1 is a cross-sectional view of the piezoelectric/electrostrictive element, and FIG. 2 is a partially enlarged cross-sectional view of FIG. 1. The piezoelectric/electrostrictive element whose structure is shown in FIGS. 1 and 2 is a piezoelectric/electrostrictive actuator for use in a head of an inkjet printer, but the invention is also applicable to other laminated piezoelectric/electrostrictive elements than the one shown.

As shown in FIGS. 1 and 2, a piezoelectric/electrostrictive element 110 is structured by laminating an electrode film 77, a piezoelectric/electrostrictive film 793 (79), an electrode film 73, a piezoelectric/electrostrictive film 795 (79), and an electrode film 75, in this order, on a diaphragm 66 that is an upper surface of a substrate 44. In the piezoelectric/electrostrictive element 110, the application of a drive signal between the electrode films 77, 75 and the electrode film 73 induces a flexural displacement of a working part 78 that is formed by alternate laminations of the electrode films 77, 73, 75 and the piezoelectric/electrostrictive films 793, 795. While FIGS. 1 and 2 show the piezoelectric/electrostrictive element 110 of a total of five layers including three layers of the electrode films 77, 73, and 75 and two layers of the piezoelectric/electrostrictive films 793 and 795, it is possible to alter the number of layers of the electrode film and the piezoelectric/electrostrictive film.

The substrate 44 is a sintered body of an insulating material. The insulating material may preferably be zirconium oxide ($ZrO_2$) with addition of a stabilizer such as calcium oxide (CaO), magnesium oxide (MgO), yttrium oxide ($Y_2O_3$), ytterbium oxide ($Yb_2O_3$), or cerium oxide ($Ce_2O_3$). That is, it is preferable to adopt a stabilized zirconium oxide or a partially stabilized zirconium oxide.

The substrate 44 includes a cavity 46 and is structured to support the diaphragm 66 in the middle with a peripheral supporting part 68. Adopting this structure to support the diaphragm 66 having a small plate thickness with the supporting part 68 having a large plate thickness allows the substrate 44 to retain its mechanical strength even if the diaphragm 66 has a reduced plate thickness. This allows an increase in flexural displacement of the piezoelectric/electrostrictive element 110.

The piezoelectric/electrostrictive films 793 and 795 are sintered bodies of a piezoelectric/electrostrictive material. The piezoelectric/electrostrictive material may preferably be a lead (Pb)-based perovskite compound. Of lead-based perovskite compounds, it is preferable to adopt a binary one of lead titanate ($PbTiO_3$) and lead zirconate ($PbZrO_3$); a ternary one of lead titanate, lead zirconate, and a third component; or either the binary or ternary one with addition of a metal oxide. In particular, it is preferable to adopt a lead-based perovskite compound formed by a ternary compound of lead titanate, lead zirconate, and lead magnesium-niobate oxide ($Pb(Mg_{1/3}Nb_{2/3})O_3$) with addition of a nickel oxide (NiO). Examples of the ternary compound as a main component include a composite material made of lead titanate zirconate and one or more kinds of materials selected from a group of $Pb(Mg_{1/3}Nb_{2/3})O_3$, $Pb(Ni_{1/3}Nb_{2/3})O_3$, $Pb(Zn_{1/2}Nb_{1/2})O_3$, and $Pb(Yb_{1/2}Nb_{1/2})O_3$ and, in particular, having a tetragonal crystal system at room temperature. The piezoelectric/electrostrictive films 793 and 795 may preferably be formed by firing after film deposition by screen printing. It is of course possible to adopt other deposition methods than screen printing.

The electrode film 77 may preferably be a sintered body of platinum (Pt) with addition of titanium oxide ($TiO_2$). Of course, it is possible to adopt other conductive materials than platinum with addition of a titanium oxide.

The electrode film 73 is a sintered body of either platinum or an alloy composed mainly of platinum (hereinafter referred to as "platinum alloy"). The electrode film 73 may preferably have a thickness of 0.5 to 2.0 μm. This is because the electrode film 73 with a thickness below this range tends to cause disconnection at the time of simultaneous firing, and also because the electrode film 73 with a thickness above this range tends to deteriorate initial piezoelectric/electrostrictive properties.

Also, it is desirable that the electrode film 73 be made of a cermet material consisting of a conductive material and a piezoelectric/electrostrictive material forming the piezoelectric/electrostrictive films 793 and 795. The electrode film 73 of such a material allows the speeds of shrinkage of the piezoelectric/electrostrictive films 793, 795 and of the electrode film 73 at the time of simultaneous firing to be brought closer to each other.

The electrode film 75 may preferably be a sintered body of gold (Au). Of course, conductive materials than gold may be adopted.

The electrode films 77, 73, and 75 may preferably be formed by tiring after film deposition by screen printing. It is of course possible to adopt other deposition methods than screen printing.

The first additive (yttrium oxide or calcium oxide) can be added to the piezoelectric/electrostrictive films 793, 795 or to the electrode film 73 prior to simultaneous firing, and the second additive (cerium oxide) can be added to the piezoelectric/electrostrictive films 793, 795 or to the electrode film 73 prior to simultaneous firing. It is to be noted that at least either one of the first and second additives, and more preferably both of the first and second additives, should be added to the electrode film 73. This is because such addition can improve the thermal resistance of platinum alloys forming the electrode film 73 and can reduce the thickness of the electrode film 73.

For addition of the first additive to the piezoelectric/electrostrictive films 793 and 795 prior to simultaneous firing, a first additive powder is added to a powder of the piezoelectric/electrostrictive material described above and may be used as it is or used after calcination. For addition of the first additive to the electrode film 73 prior to simultaneous firing, a first additive powder is added to a powder of the platinum alloy described above and used as it is.

Similarly, for addition of the second additive to the piezoelectric/electrostrictive films 793 and 795 prior to simultaneous firing, a second additive powder is added to the powder of the piezoelectric/electrostrictive material described above and may be used as it is or used after calcination. For addition of the second additive to the electrode film 73 prior to simultaneous firing, a second additive powder is added to a platinum alloy powder and used as it is.

In the case of adding both or either one of the first and second additives to the electrode film 73 prior to simultaneous firing, the piezoelectric/electrostrictive films 793 and 795, before simultaneously firing with its adjacent electrode film 73 at a temperature of 1200° C. or higher, contain substantially no additive, but after simultaneous firing with the electrode film 73, they contain the additive(s). On the other hand, the electrode film 73 contains the additive(s) before simultaneously firing with the adjacent piezoelectric/electrostrictive films 793 and 795, but after simultaneous firing with the piezoelectric/electrostrictive films 793 and 795, it contains substantially no additive. Here, "containing substantially no additive" refers to the state that the piezoelectric/electrostrictive films 793, 795 or the electrode film 73 is regarded as not containing the first or second additive even though they contain them in such a very small amount as not to affect the properties of the piezoelectric/electrostrictive films 793, 795 or the electrode film 73.

The first and second additives diffuse from the electrode film 73 to the piezoelectric/electrostrictive film 79 at the time of simultaneous firing of the electrode film 73 and the piezoelectric/electrostrictive films 793 and 795. This is because the first and second additives have a low degree of solid solubility in platinum but have a high degree of solid solubility in a lead-based perovskite compound. Such movement of the first and second additives is feasible by adding both or either one of the first and second additives, in addition to adding either a platinum powder or a powder of an alloy composed mainly of platinum, to an electrode paste for use in the formation of the electrode film 73.

In the case of selecting yttrium oxide as the first additive, a content of yttrium oxide in the piezoelectric/electrostrictive film 79 after simultaneous firing may preferably be 0.01 to 0.60 part by weight, more preferably 0.02 to 0.40 part by weight, to 100 parts by weight of platinum contained in the electrode film 73. This is because the content below this range tends to deteriorate initial piezoelectric/electrostrictive properties, and also because the content above this range tends to involve an increase in the amount of cerium oxide added and to thereby deteriorate the initial piezoelectric/electrostrictive properties.

Further, a content of cerium oxide in the electrode film 73 prior to simultaneous firing, that is, a content of cerium oxide in the piezoelectric/electrostrictive film 79 after simultaneous firing, may preferably be 0.1 to less than 1.8 parts by weight to 1 part by weight of yttrium oxide. This is because the content below this range tends to increase a change in the piezoelectric/electrostrictive properties with time, and also because the content above this range tends to deteriorate initial piezoelectric/electrostrictive properties.

In the case of selecting calcium oxide as the first additive, a content of calcium oxide in the piezoelectric/electrostrictive film 79 after simultaneous firing may preferably be 0.1 to 0.5 part by weight to 100 parts by weight of platinum contained in the electrode film 73. This is because the content below this range tends to deteriorate initial piezoelectric/electrostrictive properties, and also because the content above this range tends to involve an increase in the amount of cerium oxide added and thereby deteriorate the initial piezoelectric/electrostrictive properties.

Further, a content of cerium oxide in the electrode film 73 prior to simultaneous firing, that is, a content of cerium oxide in the piezoelectric/electrostrictive film 79 after simultaneous firing, may preferably be 0.2 to 3.0 parts by mol to 1 part by mol of calcium oxide. This is because the content below this range tends to increase a change in the piezoelectric/electrostrictive properties with time, and also because the content above this range tends to deteriorate initial piezoelectric/electrostrictive properties.

<Experiment>

The following description contains evaluation results of the piezoelectric/electrostrictive element shown in FIGS. 1 and 2 under different conditions, such as the amounts of the first and second additives added, the ways of adding the first and second additives, the thickness of the electrode film 73, and the piezoelectric/electrostrictive material to be used. In the manufacture of the piezoelectric/electrostrictive element 110, the substrate 44 is first prepared. The substrate 44 is prepared by firing a ceramic green laminate formed by lamination of ceramic green sheets of partially stabilized zirconium oxide, at a temperature of 1450° C.

Then, the working part 78 is formed on the diaphragm 66 of the substrate 44.

In the formation of the working part 78, initially, a lower-electrode paste containing a platinum powder and a titanium oxide powder is applied onto the diaphragm 66 by screen printing, and the electrode film 77 formed as a result is fired at 1300° C., This generates a sintered body of the electrode film 77 integrated with the substrate 44.

Subsequently, a piezoelectric/electrostrictive paste containing a calcined piezoelectric/electrostrictive material powder, an inner-electrode paste including a platinum powder, and a piezoelectric/electrostrictive paste are applied in sequence by screen printing, and the piezoelectric/electrostrictive film 793, the electrode film 73, and the piezoelectric/electrostrictive film 795 that are formed as a result are simultaneously fired at 1250° C. This generates a sintered body of the piezoelectric/electrostrictive film 793, the electrode film 73, and the piezoelectric/electrostrictive film 795, integrated with the substrate 44 and the electrode film 77. The piezoelectric/electrostrictive material employed may be any one of the following:
$16Pb(Mg_{1/3}Nb_{2/3})O_3+4Pb(Ni_{1/3}Nb_{2/3})O_3+43PbTiO_3+37PbZrO_3$ (hereinafter referred to as a "piezoelectric/electrostrictive material A"); $20Pb(Mg_{1/3}Nb_{2/3})O_3+43PbTiO_3+37PbZrO_3$ (hereinafter referred to as a "piezoelectric/electrostrictive material B"); $30Pb(Ni_{1/3}Nb_{2/3})O_3+42PbTiO_3+28PbZrO_3$ (hereinafter referred to as a "piezoelectric/electrostrictive material C"); $10Pb(Yb_{1/2}Nb_{1/2})O_3+48PbTiO_3+42PbZrO_3$ (hereinafter referred to as a "piezoelectric/electrostrictive material D"); and $24Pb(Zn_{1/2}Nb_{1/2})O_3+40PbTiO_3+36PbZrO_3$ (hereinafter referred to as a "piezoelectric/electrostrictive material E").

Still subsequently, an upper-electrode paste containing a gold powder is applied by screen printing, and the electrode film 75 formed as a result is fired at 800° C. This generates a sintered body of the electrode film 75.

In the formation of the working part 78, a pattern of the electrode film 77, the piezoelectric/electrostrictive film 793, the electrode film 73, the piezoelectric/electrostrictive film 795, and the electrode film 75 is such that the electrode films 75 and 77 are electrically at the same potential; the electrode films 77 and 73 face each other with the piezoelectric/electrostrictive film 793 in between; and the electrode films 73 and 79 face each other with the piezoelectric/electrostrictive film 795 in between. Further, the thicknesses of the lower-electrode paste, the inner-electrode paste, the upper-electrode paste, and the piezoelectric/electrostrictive paste at the time of application are controlled so that the electrode film 77, the piezoelectric/electrostrictive film 793, the electrode film 73, the piezoelectric/electrostrictive film 795, and the electrode film 75 after firing have thicknesses or 2.0 μm, 7.5 μm, 1.1 to 2.0 μm (described later), 8.0 μm, and 0.2 μm, respectively.

In order for the electrode film 73 to contain the first and second additives prior to simultaneous firing, a platinum powder with addition of first and second additive powders is used as the inner-electrode paste. This inner-electrode paste can be obtained by adding first and second additive powders of reagent grade to a platinum powder with a crystallite diameter of 60 nm to 100 nm and further adding a dispersant, a binder, and a solvent thereto, and kneading with a three roll mill. At this time, it is desirable that a content of the first additive previously contained in the platinum powder be quantitatively determined by ICP (Inductively Coupled Plasma) or the like, and then in consideration of this content, the first additive powder be added to achieve a desired amount of the first additive added.

Meanwhile, in order to allow the piezoelectric/electrostrictive film 79 prior to simultaneous firing to contain the first and second additives, a piezoelectric/electrostrictive material powder with addition of first and second additive powders is used as the piezoelectric/electrostrictive paste. This piezoelectric/electrostrictive paste can be obtained by adding first and second additive powders of reagent grade to a piezoelectric/electrostrictive material powder that does not substantially contain a first or second additive, and after calcination at 1000° C., further adding a dispersant, a binder, and a solvent thereto, and kneading with a three roll mill.

After the formation of the working part 78, a voltage of 100 V is applied between the electrode films 77, 75 and the electrode film 73 at a temperature of 100° C. for polarization of the piezoelectric/electrostrictive element 110.

Then, an initial flexural displacement is measured immediately after the polarization. Further, the piezoelectric/electrostrictive element 110 is left at room temperature and room humidity without application of voltage in order to measure flexural displacements after one week, after two weeks, and after three weeks, respectively. The "displacement" here refers to a displacement measured with a laser Doppler displacement gage when a drive voltage of 30 V is applied between the electrode films 77, 75 and the electrode film 73.

Still further, the thickness of the electrode film 73 in the piezoelectric/electrostrictive element 110 is measured after the measurement of the flexural displacement. This thickness is measured by polishing the piezoelectric/electrostrictive element 110 thereby to expose and observe the electrode film 73 with an electron microscope.

FIGS. 3 to 6 show the results of displacement measurements on test samples 1 to 34 manufactured, selecting yttrium oxide as the first additive and under different conditions such as the amounts of yttrium oxide and cerium oxide added, the ways of adding yttrium oxide and cerium oxide, the thickness of the electrode film 73, and the piezoelectric/electrostrictive material used. FIG. 7 shows the results of displacement measurements on test samples 35 to 42 manufactured, selecting calcium oxide as the first additive and under different conditions such as the amounts of calcium oxide and cerium oxide, and the thickness of the electrode film 73. In FIGS. 3 to 7, "(Part by Weight)" in the "Amount of $Y_2O_3$, CaO, or $CeO_2$ Added" column refers to a part by weight to 100 parts by weight of platinum contained in the electrode film 73. Also, "(Molar Ratio)" in the "Amount of $CeO_2$ Added" column refers to a ratio of the amount of substance of cerium oxide to the amount of substance of calcium oxide. The "Displacement" column in FIGS. 3 to 7 contains mean values of displacements calculated with 30 or more piezoelectric/electrostrictive elements 110. Variations in displacement measurements are approximately ±0.002 p.m. Further, the "Thickness" column in FIGS. 3 to 7 contains mean values calculated with 10 or more piezoelectric/electrostrictive elements 110. Variations in thickness measurements are approximately ±0.1 μm.

Influence of Addition or Non-Addition of Yttrium Oxide and Cerium Oxide

FIG. 3 provides a listing of the results of displacement measurements on the test samples 1 to 11 under different conditions such as addition or non-addition of yttrium oxide and cerium oxide, and the thicknesses of the electrode film 73. Piezoelectric/electrostrictive material A is used for test samples 1 to 11b, and in the case of adding yttrium oxide, 0.1 part by weight of yttrium oxide be added to the electrode film 73 prior to simultaneous firing, or in the case of adding cerium oxide, 0.6 part by weight of cerium oxide be added to the electrode film 73 prior to simultaneous firing.

As shown in FIG. 3, referring to the test samples 1 to 3 with no addition of yttrium oxide nor cerium oxide, the test sample 1 where the electrode film 73 has a thickness of 2.5 μm shows an undesirable initial displacement of 0.165 μm. On the other hand, out of the test samples 1 to 3, the test sample 2 where the electrode film 73 has a reduced thickness of 1.8 μm shows a good initial displacement of 0.190 μm, but shows an undesirable change of displacement with time, specifically −0.015 μm in three weeks. The test sample 3 where the electrode film 73 has a reduced thickness of 1.6 μm suffers a disconnection of the electrode film 73.

Referring now to the test samples 4 to 6 with addition of yttrium oxide but no addition of cerium oxide, the test samples 4 and 5 where the electrode films 73 have thicknesses of 1.9 μm and 1.4 μm, respectively, show good initial displacements of 0.199 μm and 0.216 μm, respectively, but show undesirable changes of displacement with time, specifically −0.017 μm and −0.016 μm, respectively, in three weeks. On the other hand, the test sample 6 where the electrode film 73 has a reduced thickness of 1.3 μm suffers a disconnection of the electrode film 73.

Referring further to the test samples 7 to 9 with addition of cerium oxide but no addition of yttrium oxide, the test samples 7 and 8 where the electrode films 73 have thicknesses of 1.8 μm and 1.6 μm, respectively, show good initial displacements of 0.192 μm and 0.210 μm, respectively, and also favorable changes of displacement with time, specifically both −0.002 μm three weeks. On the other hand, the test sample 9 where the electrode film 73 has a reduced thickness of 1.2 μm suffers a disconnection of the electrode film 73.

On the other hand, referring to the test samples 10 and 11 with addition of both yttrium oxide and cerium oxide, the test samples 10 and 11 where the electrode films 73 have thicknesses of 1.8 μm and 1.2 μm, respectively, show good initial displacements of 0.200 μm and 0.228 μm, respectively, and also favorable changes of displacement with time, specifically −0.002 μm and −0.001 μm, respectively, in three weeks. Besides, even the test sample 11 where the electrode film 73 has a reduced thickness of 1.2 μm suffers no disconnection of the electrode film 73.

From the results, it can be concluded that, in the case of adding both yttrium oxide and cerium oxide, good initial displacements and favorable changes of displacement with time can be achieved even if the thickness of the electrode film 73 is 2.0 μm or less, and the thickness of the electrode film 73 can be reduced to at least 1.2 μm.

Influence of Ways of Adding Yttrium Oxide and Cerium Oxide

FIG. 4 provides a listing of the results of displacement measurements on the test samples 12 to 18 with different ways of adding yttrium oxide and cerium oxide and different thicknesses of the electrode film 73. Piezoelectric/electrostrictive material A is used for test samples 12 to 18, and 0.1 part by weight of yttrium oxide and 0.6 part by weight of cerium oxide be added to the electrode film 73 or to the piezoelectric/electrostrictive film 9 prior to simultaneous firing.

As shown in FIG. 4, referring to the test samples 12 to 14 with addition of both yttrium oxide and cerium oxide to the piezoelectric/electrostrictive film 79, the test sample 12 where the electrode film 73 has a thickness of 1.8 μm shows a good initial displacement of 0.200 μm, and also a favorable change of displacement with time, specifically −0.002 μm in three weeks. However, the test samples 13 and 14 where the electrode films 73 have reduced thicknesses of 1.5 μm and 1.2 μm, respectively, suffer disconnections of the electrode films 73.

Referring to the test samples 15 and 16 with addition of yttrium oxide to the electrode film 73 and cerium oxide to the piezoelectric/electrostrictive film 79, the test sample 15 where the electrode film 73 has a thickness of 1.4 μm shows a good initial displacement of 0.220 μm, and also a favorable change of displacement with time, specifically −0.004 μm in three weeks. However, the test sample 16 where the electrode film 73 has a reduced thickness of 1.2 μm suffers a disconnection of the electrode film 73.

Referring further to the test samples 17 and 18 with addition of yttrium oxide to the piezoelectric/electrostrictive film 79 and cerium oxide to the electrode film 73, the test sample 17 where the electrode film 73 has a thickness of 1.6 μm shows a good initial displacement of 0.216 μm, and desirably no change of displacement with time, ±0.000 μm in three weeks. However, the test sample 18 where the electrode film 73 has a reduced thickness of 1.2 μm suffers a disconnection of the electrode film 73.

From the results, it can be concluded that, in the case of adding both or either one of yttrium oxide and cerium oxide to the piezoelectric/electrostrictive film 79, as in the case of adding both yttrium oxide and cerium oxide to the electrode film 73, good initial displacements and favorable changes of displacement with time can be achieved even if the thickness of the electrode film 73 is 2.0 μm or less; however, unlike in the case of adding both yttrium oxide and cerium oxide to the electrode film 73, the thickness of the electrode film 73 cannot be reduced to 1.2 μm.

Influence of Amounts of Yttrium Oxide and Cerium Oxide Added FIG. 5 provides a listing of the results of displacement measurements on the test samples 19 to 29 with different amounts of yttrium oxide and cerium oxide added. Piezoelectric/electrostrictive material A is used for test samples 19 to 29; yttrium oxide and cerium oxide be added to the electrode film 73 prior to simultaneous firing; and the thickness of the electrode film 73 be in the range of 1.1 to 1.3 μm.

As shown in FIG. 5, the test samples 19 to 22 and 24 to 28 with addition of 0.01 to 0.60 part by weight of yttrium oxide and addition of 0.1 to less than 1.8 parts by weight of cerium oxide show especially good initial displacements in the range of 0.220 to 0.230 μm. However, the test sample 23 with addition of 1.8 parts by weight of cerium oxide, and the test sample 29 with addition of more than 0.6 part by weight of yttrium oxide tend to show reduced initial displacements of 0.212 μm and 0.210 μm, respectively.

Influence of Piezoelectric/Electrostrictive Material

FIG. 6 provides a listing of the results of displacement measurements on the test samples 30 to 34 with different piezoelectric/electrostrictive materials. For the test samples 30 to 34, let 0.1 part by weight of yttrium oxide and 0.6 part by weight of cerium oxide be added to the electrode film 73 prior to simultaneous firing, and the thickness of the electrode film 73 be in the range of 1.1 to 1.2 μm.

As shown in FIG. 6, the test samples 30 to 36 show good initial displacements of 0.195 to 0.230 μm and also favorable changes of displacement with time, specifically in the range of −0.003 to +0.001 μm in three weeks.

This indicates that the effect of addition of yttrium oxide and cerium oxide can be achieved irrespective of the piezoelectric/electrostrictive material.

Influence of Amounts of Calcium Oxide and Cerium Oxide Added

FIG. 7 provides a listing of the results of displacement measurements on the test samples 35 to 42 with different amounts of calcium oxide and cerium oxide. Piezoelectric/electrostrictive material A is used for test samples 35 to 42; calcium oxide and cerium oxide be added to the electrode film 73 prior to simultaneous firing; and the thickness of the electrode film 73 be in the range of 1.1 to 1.3 μm.

As shown in FIG. 7, the test samples 35 to 42 with addition of 0.1 to 0.5 part by weight of calcium oxide and 0.2 to 3 molar ratio of cerium oxide show good initial displacements of 0.225 to 0.231 μm, and also favorable changes of displacement with time, specifically in the range of −0.002 to +0.002 μm in three weeks.

<Verification of Movement of Yttrium Oxide, Calcium Oxide, and Cerium Oxide>

The test samples 12 to 42 described above are subjected to ion etching to expose their cross-sections, and the distribution of yttrium oxide, calcium oxide, and cerium oxide is investigated by electron probe micro analysis (EPMA). The result is that no segregation of cerium oxide, calcium oxide, and yttrium oxide is recognized in the vicinity of the electrode film 73 nor in the piezoelectric/electrostrictive film 79.

Further, the test samples 12 to 42 described above are subjected to ion etching to expose their cross-sections, and only their working parts 78 are dissolved to quantitatively determine the contents of yttrium oxide, calcium oxide, and cerium oxide in a resultant solution by ICP. The result is that equivalent amounts of yttrium oxide, calcium oxide, and cerium oxide contents to the amounts added are recognized.

Moreover, an inner-electrode paste obtained by adding a yttrium oxide powder and a cerium oxide powder to a platinum powder is applied onto a substrate of zirconium oxide by screen printing, and then, a resultant film is tired and observed. As a result, segregation of yttrium oxide and cerium oxide is recognized in the surface. This indicates that yttrium oxide and cerium oxide have a low degree of solid solubility in platinum contained in the inner-electrode paste. Also, an inner-electrode paste obtained by adding a calcium oxide powder and a cerium oxide powder to a platinum powder is applied on a substrate of zirconium oxide by screen printing, and then, a resultant film is fired and observed. The result is that segregation of calcium oxide and cerium oxide is recognized in the surface. This indicates that calcium oxide and cerium oxide have a low degree of solid solubility in platinum contained in the inner-electrode paste.

From the facts described above, it is conceivable that yttrium oxide, calcium oxide, and cerium oxide will diffuse from the electrode film 73 to the piezoelectric/electrostrictive film 79 without evaporation at the time of simultaneous firing, and they are distributed uniformly within a sintered body of the piezoelectric/electrostrictive film 79 after simultaneous firing.

<Others>

While the invention has been shown and described in detail, the foregoing description is in all aspects illustrative and not restrictive. It is therefore understood that numerous modifications and variations can be devised without departing from the scope of the invention.

What is claimed is:

1. A laminated piezoelectric/electrostrictive element comprising:
    an electrode film being a sintered body of either platinum or an alloy composed mainly of platinum and having a thickness of 2.0 μm or less; and
    a piezoelectric/electrostrictive film, directly contacting said electrode film and comprising a sintered body of a piezoelectric/electrostrictive material including 0.1 to 0.5 part by weight of calcium oxide to 100 parts by weight of platinum contained in said electrode film and containing 0.2 to 3.0 parts by mol of cerium oxide to 1 part by mol of calcium oxide.

2. The laminated piezoelectric/electrostrictive element according to claim 1, wherein
    said piezoelectric/electrostrictive material is composed mainly of a composite material including lead titanate zirconate and one or more materials selected from the group consisting of $Pb(Mg_{1/3}Nb_{2/3})O_3$, $Pb(Ni_{1/3}Nb_{2/3})O_3$, $Pb(Zn_{1/2}Nb_{1/2})O_3$, and $Pb(Yb_{1/2}Nb_{1/2})O_3$.

3. The laminated piezoelectric/electrostrictive element according to claim 2, wherein
    said piezoelectric/electrostrictive material has a tetragonal crystal system at room temperature.

* * * * *